(12) United States Patent
Zhang et al.

(10) Patent No.: US 11,984,894 B2
(45) Date of Patent: May 14, 2024

(54) SYSTEM AND METHOD FOR GENERATING ARBITRARY WAVEFORM OF MICROWAVE PHOTON BASED ON OPTICAL FREQUENCY TUNING

(71) Applicant: CHINA ELECTRONICS TECHNOLOGY GROUP CORPORATION NO 44 RESEARCH INSTITUTE, Chongqing (CN)

(72) Inventors: Hao Zhang, Chongqing (CN); Yongchuan Xiao, Chongqing (CN); Caibin Yu, Chongqing (CN); Xu Liang, Chongqing (CN); Lijun Sun, Chongqing (CN)

(73) Assignee: CHINA ELECTRONICS TECHNOLOGY GROUP CORPORATION NO 44 RESEARCH INSTITUTE, Chongqing (CN)

( * ) Notice: Subject to any disclaimer, the term of this patent is extended or adjusted under 35 U.S.C. 154(b) by 0 days.

(21) Appl. No.: 18/149,642

(22) Filed: Jan. 3, 2023

(65) Prior Publication Data

US 2024/0120907 A1 Apr. 11, 2024

(30) Foreign Application Priority Data

Oct. 8, 2022 (CN) .......................... 202211223029.7

(51) Int. Cl.
  *H03K 5/00* (2006.01)
  *H03K 5/1252* (2006.01)
  *H03K 21/08* (2006.01)
  *H04B 10/58* (2013.01)

(52) U.S. Cl.
  CPC ....... *H03K 5/00006* (2013.01); *H03K 5/1252* (2013.01); *H03K 21/08* (2013.01); *H04B 10/58* (2013.01)

(58) Field of Classification Search
  CPC .. H03K 21/08; H03K 5/00006; H03K 5/1252; H04B 10/508; G06F 1/022
  See application file for complete search history.

(56) References Cited

U.S. PATENT DOCUMENTS

| 10,763,969 B2* | 9/2020 | Kim ..................... H04B 10/524 |
| 10,901,295 B2* | 1/2021 | Heebner ............... G02F 1/3551 |
| 11,032,009 B1* | 6/2021 | Lee ........................ H04B 10/11 |

(Continued)

*Primary Examiner* — Tuan T Lam

(57) ABSTRACT

A system and a method for generating an arbitrary waveform of a microwave photon based on optical frequency tuning are provided. The system includes an optical frequency comb, a first optical distribution unit, a first photoelectric conversion unit, a frequency-shift drive circuit, and an optical frequency doubling/dividing unit, an optical frequency-shift combining optical circuit, a second photoelectric conversion unit, and a second electrical processing circuit. The optical frequency comb is used as the frequency source, with the features of high stability and low phase noise of the optical frequency comb, the arbitrary waveforms of microwave photons can be generated through optical frequency tuning control; the performance of the optical frequency comb is three orders of magnitude or more higher than that of the common microwave frequency sources, therefore, the waveforms with high-frequency, ultra-wideband, low phase noise, and high stability can be generated.

7 Claims, 4 Drawing Sheets

(56) References Cited

U.S. PATENT DOCUMENTS

2021/0231004 A1* 7/2021 Bhongale ........... G01N 33/2835
2023/0130434 A1* 4/2023 Mokhtari-Koushyar ....................
　　　　　　　　　　　　　　　　　　　　　H04B 10/503
　　　　　　　　　　　　　　　　　　　　　398/200

* cited by examiner

SYSTEM AND METHOD FOR GENERATING ARBITRARY WAVEFORM OF MICROWAVE PHOTON BASED ON OPTICAL FREQUENCY TUNING

FIELD

The subject matter herein generally relates to a technology of waveform generation, and particularly to a system and a method for generating an arbitrary waveform of a microwave photon based on optical frequency tuning.

BACKGROUND

Arbitrary waveform generation is a core supporting technology for radars, satellites, ground communication, position sensing, navigation technologies, and other major infrastructures. With the development requirement of bottleneck breakthrough and upgrading of the electronic information systems, ultra-wideband arbitrary waveform generation of ultra-low phase noise has become one of the important fields and directions of technology development of frequency synthesis, and with the requirement for miniaturization and higher performance of the electronic systems, for the design of miniaturization, fine stepping, low spurious, and low phase noise generated by wideband arbitrary waveforms, higher requirements are also put forward.

Conventional waveform generation methods based on such as crystal oscillator and microwave frequency doubling exist the inherent bottleneck of mutual restriction in the generation and synthesis of high-frequency ultra-wideband and low-phase noise frequencies, the development of such conventional waveform generation methods cannot meet the requirement of the performance of synthetic waveform with the upgrade of the electronic information system, therefore, it is necessary to look for a new generation of arbitrary waveform generation technology with ultra-low phase noise and ultra-wideband. With the rapid development of microwave photonic technology, the arbitrary waveforms based on optoelectronic oscillators can generate large time-bandwidth product signals. However, due to the limit of the tuning mechanism, the indicators such as phase noise and stability are far behind the point-frequency signal generation, thus, it is urgent to carry out a new mechanism study for the arbitrary waveform generation with ultra-low phase noise and ultra-wideband.

SUMMARY

In view of the shortcomings of the prior art, the problem to be solved according to the present disclosure is providing a system and a method for generating an arbitrary waveform of a microwave photon based on optical frequency tuning with higher performance.

To achieve the above purpose, the present disclosure provides the following embodiment:

A system and for generating an arbitrary waveform of a microwave photon based on optical frequency tuning, includes:
  at least one processor; and
  a storage device coupled to the at least one processor and storing instructions for execution by the at least one processor to cause the at least one processor to:
    generate narrow optical pulse signals with high stability and low phase noise through an optical frequency comb;
    divide the narrow optical pulse signals output by the optical frequency comb into two channels through a first optical distribution unit, wherein one channel of the narrow optical pulse signals is output to a first photoelectric conversion unit, and the other channel of the narrow optical pulse signals is output to an optical frequency doubling/dividing unit;
    perform photoelectric conversion on the narrow optical pulse signals transmitted by the first optical distribution unit through the first photoelectric conversion unit, and output an electrical frequency comb;
    generate a frequency-shift driving electrical waveform for driving an optical frequency-shift combining optical circuit according to the electrical frequency comb through a frequency-shift drive circuit;
    perform frequency doubling or dividing on a repetition frequency of the narrow optical pulse signals output by the optical frequency comb through the optical frequency doubling/dividing unit;
    divide optical pulse signals output by the optical frequency doubling/dividing unit into two channels through the optical frequency-shift combining optical circuit, wherein one channel of the optical pulse signals is optically frequency-shifted by driving of the frequency-shift drive electrical waveform, and is combined with the other channel of the optical pulse signals that is not frequency-shifted for output;
    perform the photoelectric conversion on the combined optical pulse signals, and output an electrical waveform through a second photoelectric conversion unit; and
    perform an electrical process on the electrical waveform, and obtain an electrical waveform with a specific frequency spectrum through a second electrical processing circuit.

A method for generating an arbitrary waveform of a microwave photon based on optical frequency tuning, includes:
  generating narrow optical pulse signals with high stability and low phase noise through an optical frequency comb;
  dividing the narrow optical pulse signals into two channels, performing a frequency doubling or frequency dividing process on a repetition frequency of the narrow optical pulse signals by a first channel, and performing photoelectric conversion on the narrow optical pulse signals by a second channel to generate an electrical frequency comb, and performing an electrical process on the electrical frequency comb by the second channel to generate a frequency-shift driving electrical waveform required for optical frequency-shift;
  dividing optical pulse signals after the frequency doubling or dividing process into two channels, after driving one channel of the optical pulse signals by the frequency-shift driving electrical waveform to be frequency shifted, combining the one channel of the optical pulse signals with the other channel of the optical pulse signals that is not frequency-shifted for output;
  performing the photoelectric conversion on the combined optical pulse signals, and generating an electrical waveform;
  filtering out an electrical waveform with a specific frequency spectrum from the electrical waveform generated after the photoelectric conversion by electrical filtering; and
  performing power amplification on the filtered electrical waveform for output.

In the present disclosure, the optical frequency comb is taken as frequency source, with the features of high stability and low phase noise of the optical frequency comb, the arbitrary waveforms of microwave photons can be generated through optical frequency tuning control; since the operation frequency of the optical frequency comb is three orders of magnitude or more higher than that of common microwave frequency sources (e.g., the crystal oscillator), and its performance is three orders of magnitude or more higher than that of the common microwave frequency sources, therefore, the waveforms with high-frequency, ultra-wideband, low phase noise, and high stability can be generated.

BRIEF DESCRIPTION OF THE DRAWINGS

In order to clearly explain technical solutions of embodiments of the present disclosure or in the related art, drawings used in the description of the embodiments or the related art are briefly described below. Obviously, the drawings as described below are merely some embodiments of the present disclosure. Based on these drawings, other drawings can be obtained by those skilled in the art without paying creative efforts.

DETAILED DESCRIPTION

Figure 1:
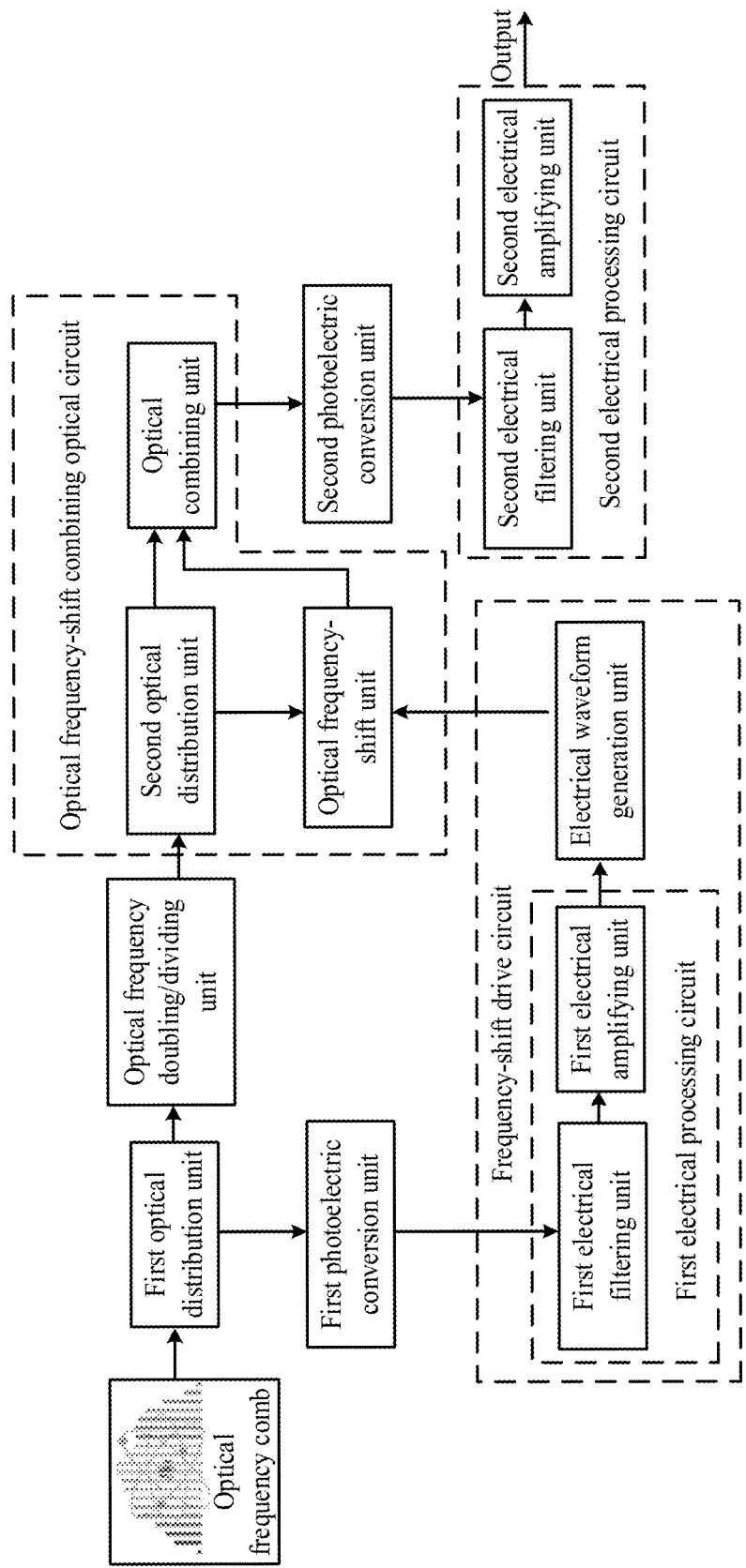
FIG. 1 illustrates a block diagram of an embodiment of a system for generating an arbitrary waveform of a microwave photon based on optical frequency tuning according to the present disclosure.

Multiple embodiments are described in the present disclosure, but the description is exemplary rather than limiting, and there may be more embodiments and implementation solutions within the scope of the embodiments described in the present disclosure. Although many possible combinations of features are shown in the drawings and discussed in the detailed description, many other combinations of the disclosed features are also possible. Unless specifically limited, any feature or element of any embodiment may be used in combination with or in place of any other feature or element of any other embodiment.

When describing representative embodiments, the specification may have presented methods and/or processes as a specific sequence of steps. However, to the extent that the method or process does not depend on the specific order of steps described in the present disclosure, the method or process should not be limited to the specific order of steps described. As understood by those of ordinary skills in the art, other orders of steps are also possible. Therefore, the specific order of steps set forth in the specification should not be interpreted as limitation to the claims. In addition, the claims for the method and/or process should not be limited to the steps performed in the written order, and those of skilled in the art may readily understand that these orders may vary and still remain within the essence and scope of the embodiments of the present disclosure.

Unless otherwise defined, technical terms or scientific terms used in the embodiments shall have common meanings as construed by those of ordinary skills in the art to which the present disclosure pertains. The terms "first", "second" and the like used in the embodiments of the present disclosure do not represent any order, quantity or importance, but are merely configured to distinguish among different components. The terms "include", "contain" or the like mean that elements or articles appearing before the words cover elements or articles listed after the words and their equivalents, without excluding other elements or articles. The terms "connect", "link" or the like are not limited to physical or mechanical connection, but may include electrical connection, whether direct or indirect.

As illustrated in FIG. 1, the present disclosure provides a system for generating an arbitrary waveform of a microwave photon based on optical frequency tuning, including an optical frequency comb, a first optical distribution unit, a first photoelectric conversion unit, a frequency-shift drive circuit, and an optical frequency doubling/dividing unit, an optical frequency-shift combining optical circuit, a second photoelectric conversion unit, and a second electrical processing circuit.

The optical frequency comb is configured to generate narrow optical pulse signals with high stability and low phase noise; for example, the optical frequency comb can output the narrow optical pulse signals with a pulse width of 100 fs; the pulse width can also be greater or less than 100 fs. The first optical distribution unit is configured to divide the narrow optical pulse signals output by the optical frequency comb into two channels, one channel of the narrow optical pulse signals is output to the first photoelectric conversion unit, and the other channel of the narrow optical pulse signals is output to the optical frequency doubling/dividing unit. The first photoelectric conversion unit is configured to perform photoelectric conversion for the optical pulse signals transmitted by the first optical distribution unit, and output an electrical frequency comb. The optical frequency doubling/dividing unit is configured to perform frequency doubling or frequency dividing for the repetition frequency of the optical pulse signals output by the optical frequency comb.

The frequency-shift drive circuit is configured to generate a frequency-shift driving electrical waveform for driving the optical frequency-shift combining optical circuit according to an electrical frequency comb. The frequency-shift drive circuit may include a first electrical processing circuit and an electrical waveform generation unit, the first electrical processing circuit is configured to perform an electrical process on the electrical frequency comb, obtain signals with a specific frequency, and determine the signals with the specific frequency to be frequency reference signals or local oscillator signals of the electrical waveform generation unit. The first electrical processing circuit may include a first electrical filtering unit and a first electrical amplifying unit, the first electrical filtering unit is configured to filter the electrical frequency comb, and obtain the frequency reference signals or the local oscillator signals with a specific frequency; the first electrical amplifying unit is configured to amplify the signals output by the first electrical filtering unit. The electrical waveform generation unit is configured to generate a basic electrical waveform according to the input frequency reference signals or the local oscillator signals, and determine the basic electrical waveform to be the frequency-shift driving electrical waveform for driving the optical frequency-shift unit.

The optical frequency-shift combining optical circuit is configured to divide the optical pulse signals output by the optical frequency doubling/dividing unit into two channels, and one channel of the optical pulse signals is optically frequency-shifted by driving of the frequency-shift drive electrical waveform, combines the one channel of the optical pulse signals that is optically frequency-shifted with the other channel of the optical pulse signals that is not frequency-shifted, and output the combined signals. The optical frequency-shift combining optical circuit may include a second optical distribution unit, an optical combining unit, and an optical frequency-shift unit; the second optical distribution unit and the optical combining unit form a Mach Ze Delphi Interferometer (MZI) structure. The second optical distribution unit is configured to divide the optical pulse signals output by the optical frequency doubling/dividing unit into two channels, transmit one channel of the optical pulse signals to the optical combining unit, and transmit the other channel of the optical pulse signals to the optical frequency-shift unit. The optical frequency-shift unit is configured to perform spectral shift on the narrow optical pulse signals transmitted by the second optical distribution unit according to the frequency-shift driving electrical waveform transmitted by the frequency-shift drive circuit. The optical combining unit is configured to combine the optical signals transmitted by the second optical distribution unit and the optical frequency-shift unit, and output the combined optical signals.

The second photoelectric conversion unit is configured to perform photoelectric conversion on the combined optical pulse signals, and output an electrical waveform. The second electrical processing circuit is configured to perform an electrical process on the electrical waveform, and obtain an electrical waveform with a specific frequency spectrum. The second electrical processing circuit includes a second electrical filtering unit and a second electrical amplifying unit, and the second electrical filtering unit is configured to filter the electrical waveform output by the second photoelectric conversion unit, and obtain a required electrical waveform; the second electrical amplifying unit is configured to amplify the electrical waveform (i.e., the required electrical waveform) output by the second electrical filtering unit.

An output end of the optical frequency comb is connected with an input end of the first optical distribution unit through an optical path (e.g., an optical fiber), a first output end of the first optical distribution unit is connected with an input end of the optical frequency doubling/dividing unit through the optical path, and a second output end is connected with the input end of the first photoelectric conversion unit through the optical path. An output end of the first photoelectric conversion unit is electrically connected with an input end of the first electrical filtering unit, an output end of the first electrical filtering unit is electrically connected with an input end of the first electrical amplifying unit, an output end of the first electrical amplifying unit is electrically connected with an input end of the electrical waveform generation unit, and an output end of the electrical waveform generation unit is electrically connected with an input end of radio frequency of the optical frequency-shift unit.

The output end of the optical frequency doubling/dividing unit is connected with the input end of the second optical distribution unit through the optical path, the first output end of the second optical distribution unit is connected with the first input end of the optical combining unit through the optical path, the second output end of the second optical distribution unit is connected with the optical input end of the optical frequency-shift unit through the optical path, the output end of the optical frequency-shift unit is connected with the second input end of the optical combining unit through the optical path, the output end of the optical combining unit is connected with the second photoelectric conversion unit through the optical circuit, the output end of the second photoelectric conversion unit is electrically connected with the input end of the second electrical filtering unit, and the output end of the second electrical filtering unit is electrically connected with the input end of the second electrical amplifying unit, the output end of the second electrical amplifying unit is configured to output an electrical waveform with a specific frequency spectrum required by users.

An operation principle of this embodiment is as follows:

As illustrated in FIG. 1, when the system is operating, the optical frequency comb generates narrow optical pulse signals with high stability and low phase noise, and the optical pulse signals are divided into two channels in the first optical distribution unit, a first channel of the optical pulse signals is transmitted to the first photoelectric conversion unit, and a second channel of the optical pulse signals is transmitted to the optical frequency doubling/dividing unit.

The narrow optical pulse signals in the first channel are photoelectrically converted by the first photoelectric conversion unit to generate an electrical frequency comb; the first electrical filtering unit performs a filtering process on the electrical frequency comb, filters out the signals with a specific frequency from the electrical frequency comb, takes the signals with the specific frequency as frequency reference signals or local oscillator signals, and transmits the signals with the specific frequency to the electrical waveform generation unit, the electrical waveform generation unit generates a basic electrical waveform as a frequency-shift driving electrical waveform.

The narrow optical pulse signals in the second channel are frequency multiplied or divided by the optical frequency doubling/dividing unit, and is divided into two channels after power dividing by the second optical distribution unit, the first output of the second optical distribution unit is directly transmitted to the optical combining unit without any process, and the second output of the second optical distribution unit is transmitted to the optical frequency-shift unit, the optical frequency-shift unit is driven by the frequency-shift driving electrical waveform output by the electrical waveform generation unit, to perform frequency shifting on the narrow optical pulse signals and transmit the narrow optical pulse signals after frequency shifting to the optical combining unit, thus, the optical combining unit performs power combining on the narrow optical pulse signals after frequency shifting and the optical signals of first output of the second optical distribution unit; the combined optical pulse signals are transmitted to the second photoelectric conversion unit for photoelectric conversion to generate the electrical waveform; the electrical waveform is filtered by the second electrical filtering unit, and an electrical waveform with a specific frequency spectrum is output; the second electrical amplifying unit performs power amplification on the filtered electrical waveform with the specific frequency spectrum, and outputs the electrical waveform required by the users.

The present embodiment is described below by taking an example of generating an electrical waveform (e.g., frequency sweep signals) with a center frequency of 21 GHz and a bandwidth of 200 MHz. It is assumed that an output pulse width of the optical frequency comb is 100 fs and the repetition frequency is 1 GHz, the optical pulse signals are divided into two channels by the first optical distribution unit, an optical distribution ratio is 10:90.

The narrow optical pulse signals (i.e., 10% of the initial narrow optical pulse signals) of the first channel are photoelectrically converted by the first photoelectric conversion unit, to generate an electrical frequency comb with an interval of 1 GHz, which is transmitted to the first electrical filtering unit. By setting a filtering frequency to 1 GHz, the first electrical filtering unit filters out the signals with a frequency of 1 GHz as frequency reference signals or local oscillator signals, and transmits the signals with the frequency of 1 GHz to the electrical waveform generation unit through the first electrical amplifying unit, the electrical waveform generation unit generates a basic electrical waveform with a center frequency of 1 GHz and a bandwidth of 200 MHz by using a digital synthesis method according to the input local oscillator signals with the frequency of 1 GHz, the basic electrical waveform is taken as a frequency-shift driving electrical waveform to drive the optical frequency-shift unit to perform frequency up-shift.

The repetition frequency of the narrow optical pulse signals (i.e., 90% of the initial narrow optical pulse signals) in the second channel is 10 frequency doubling processed by the optical frequency doubling/dividing unit by using a fiber Mach-Zehnder interferometer (MZI) method, the optical frequency doubling/dividing unit transmits the optical pulse signals after 10 frequency doubling process to the second optical distribution unit, an optical distribution ratio of the second optical distribution unit is 50:50, the second optical distribution unit divides the optical pulse signals after 10 frequency doubling process into two channels, directly transmits one channel to the optical combining unit, and transmits the other channel to the optical frequency-shift unit, the optical frequency-shift unit is driven by the frequency-shift driving electrical waveform to perform the frequency up-shift on the optical pulse signals after 10 frequency doubling process, the frequency-shifted signals are combined with the optical pulse signals of the other channel without frequency-shift in the optical combining unit, and the electrical waveform is generated after the photoelectric conversion by the photoelectric conversion unit, the second electrical filtering unit filters out the required electrical waveform with a center frequency of 21 GHz and a bandwidth of 200 MHz from the electrical waveform; the second electrical amplifying unit amplifies the power of the filtered electrical waveform, obtains the required electrical waveform, and outputs the required electrical waveform to the user.

Figure 2:
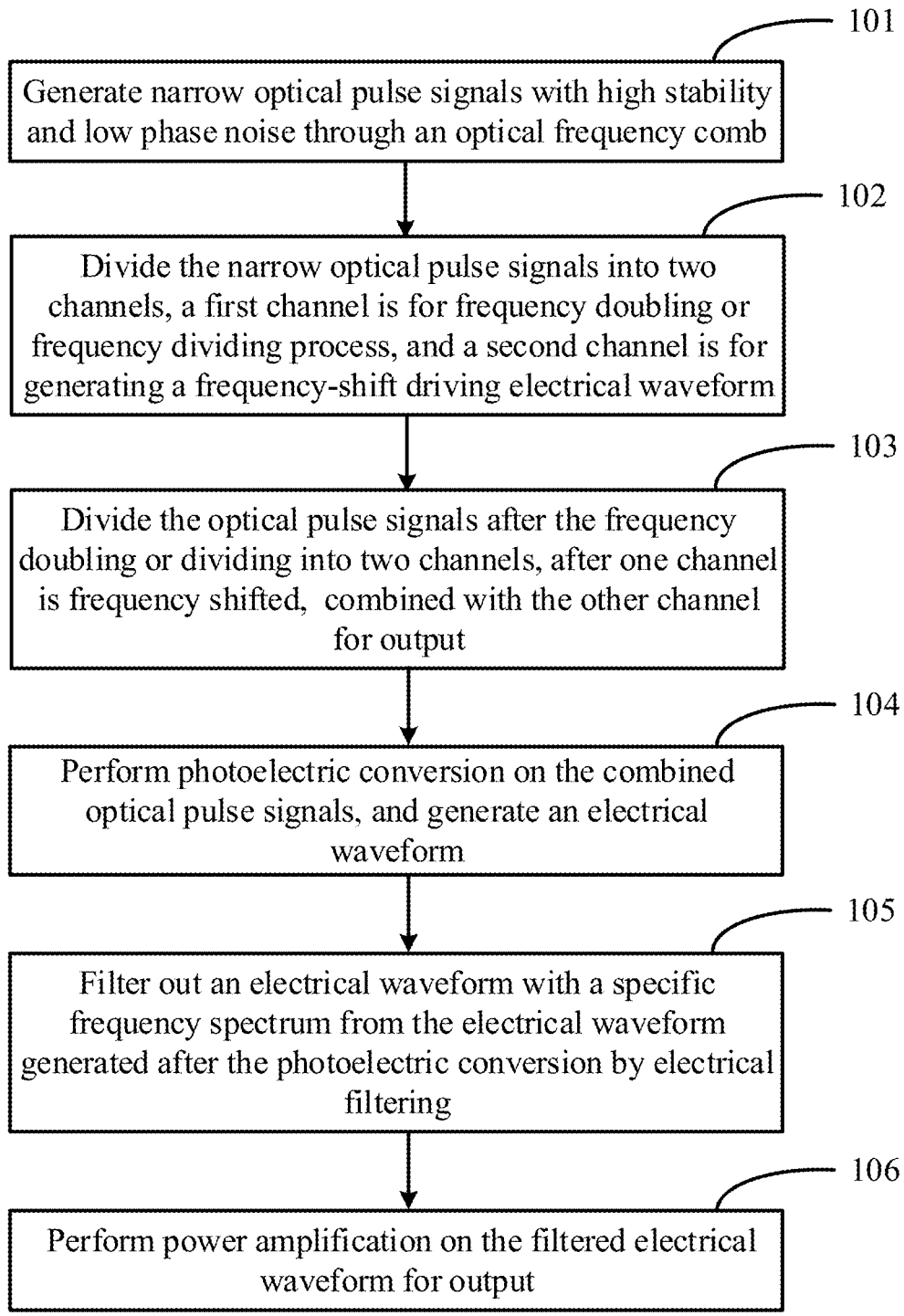
FIG. 2 illustrates a flowchart of an embodiment of a method for generating an arbitrary waveform of a microwave photon based on optical frequency tuning according to the present disclosure.

FIG. 2 illustrates a flowchart of an embodiment of a method for generating an arbitrary waveform of a microwave photon based on optical frequency tuning. The method is provided by way of example, as there are a variety of ways to carry out the method. Each block shown in FIG. 2 represents one or more processes, methods, or subroutines carried out in the example method. Furthermore, the illustrated order of blocks is by example only and the order of the blocks can be changed. Additional blocks may be added or fewer blocks may be utilized, without departing from this disclosure. The example method can begin at block 101.

At block 101, generating narrow optical pulse signals with high stability and low phase noise through an optical frequency comb. For example, an optical frequency comb can generate the narrow optical pulse signals with a repetition frequency of 1 GHz.

At block 102, dividing the narrow optical pulse signals into two channels, performing a frequency doubling or frequency dividing process on the repetition frequency of the narrow optical pulse signals by a first channel, and performing photoelectric conversion on the narrow optical pulse signals by a second channel to generate an electrical frequency comb, and performing an electrical process on the electrical frequency comb by the second channel to generate a frequency shift driving electrical waveform required for optical frequency shift. For example, when an electrical waveform with a center frequency of 21 GHz and a bandwidth of 200 MHz is required, the first channel multiplies the repetition frequency of the narrow optical pulse signals by 10. An electrical frequency comb with an interval of 1 GHz is obtain after the second channel performing the photoelectric conversion on the narrow optical pulse signals with the repetition frequency of 1 GHz.

Figure 3:
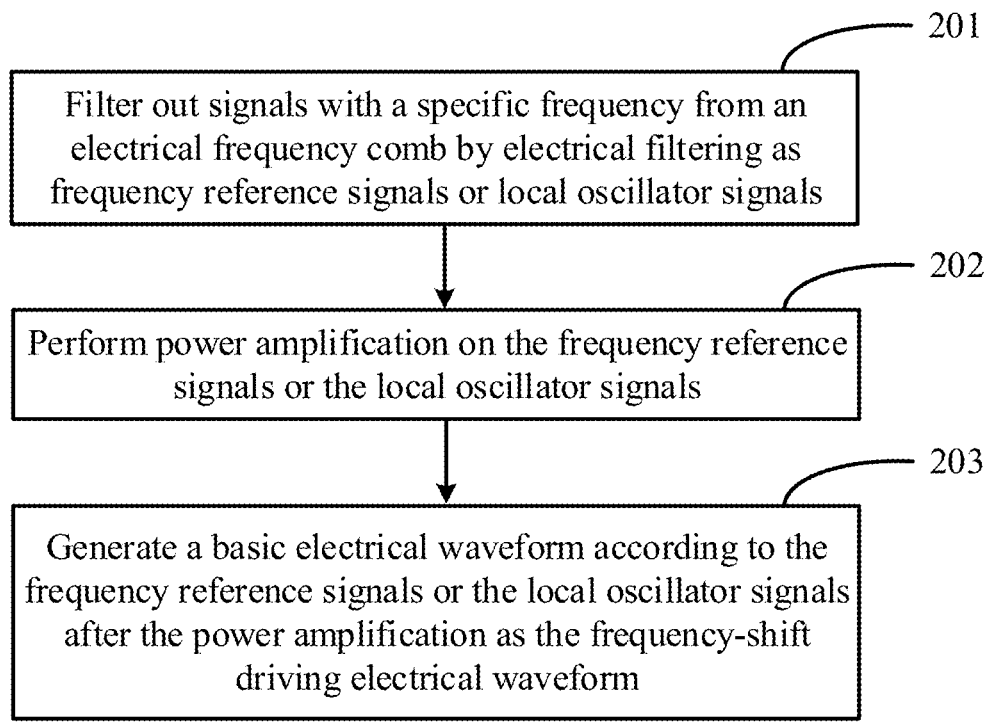
FIG. 3 illustrates a flowchart of an embodiment of performing an electrical process on an electrical frequency comb to generate a frequency shift driving electrical waveform according to the present disclosure.

FIG. 3 illustrates a flowchart of an embodiment of performing an electrical process on an electrical frequency comb to generate a frequency shift driving electrical waveform. The method is provided by way of example, as there are a variety of ways to carry out the method. Each block shown in FIG. 3 represents one or more processes, methods, or subroutines carried out in the example method. Furthermore, the illustrated order of blocks is by example only and the order of the blocks can be changed. Additional blocks may be added or fewer blocks may be utilized, without departing from this disclosure. The example method can begin at block 201.

At block 201, filtering out signals with a specific frequency from an electrical frequency comb by electrical filtering, and taking the signals with the specific frequency as frequency reference signals or local oscillator signals. For example, the signals with a frequency of 1 GHz can be filtered out from the electrical frequency comb with the interval of 1 GHz as frequency reference signals or local oscillator signals.

At block 202, performing power amplification on the signals (i.e., the frequency reference signals or the local oscillator signals) with the frequency of 1 GHz, and driving the electrical waveform generation unit.

At block 203, generating a basic electrical waveform with a center frequency of 1 GHz and a bandwidth of 200 MHz by the electrical waveform generation unit according to the signals with the frequency of 1 GHz after the power amplification, and taking the basic electrical waveform as a frequency-shift driving electrical waveform for driving the optical frequency-shift unit.

At block 103, dividing the optical pulse signals after the frequency doubling or dividing into two channels, after driving one channel of the optical pulse signals by the frequency-shift driving electrical waveform to be frequency shifted, combining the one channel of the optical pulse signals with the other channel of the optical pulse signals that are not frequency-shifted, and outputting the combined optical pulse signals. For example, the optical pulse signals after 10 frequency doubling process can be divided into two channels, one channel is frequency up-shifted by the optical frequency-shift unit, and combined with the other channel of the optical pulse signals that is not frequency-shifted in the optical combining unit for output.

At block 104, performing photoelectric conversion on the combined optical pulse signals, and generating an electrical waveform.

At block 105, filtering out an electrical waveform with a specific frequency spectrum required by a user from the electrical waveform generated after the photoelectric conversion by electrical filtering.

At block 106, performing power amplification on the filtered electrical waveform, and obtaining a required electrical waveform for outputting to the user.

In this embodiment, the optical frequency comb is taken as the frequency source, with the features of high stability and low phase noise of the optical frequency comb, the arbitrary waveforms of microwave photons can be generated through optical frequency tuning control; since the operation frequency of the optical frequency comb is three orders of magnitude or more higher than that of common microwave frequency sources (e.g., the crystal oscillator), and its performance is three orders of magnitude or more higher than that of the common microwave frequency sources, therefore, the waveforms with high-frequency, ultra-wideband, low phase noise, and high stability can be generated. In addition, the components in this embodiment are common to the prior art, and the technology is mature and reliable.

Figure 4:
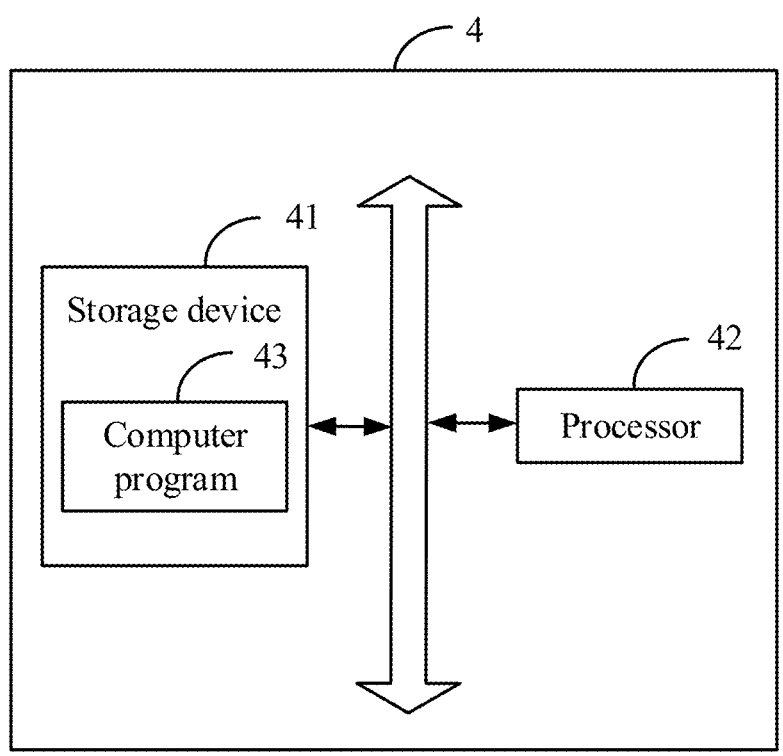
FIG. 4 is the other block diagram of an embodiment of the system for generating an arbitrary waveform of a microwave photon based on optical frequency tuning according to the present disclosure.

FIG. 4 illustrates a system 4 for generating an arbitrary waveform of a microwave photon based on optical frequency tuning in one embodiment. The system 4 includes, but is not limited to, a storage device 41, a processor 42, and a computer program 43. The system 4 can be a computer that communicates with the system for generating an arbitrary waveform of a microwave photon based on optical frequency tuning. FIG. 4 illustrates only one example of the system 4. Other examples can include more or fewer components than as illustrated or have a different configuration of the various components in other embodiments.

The processor 42 can be a central processing unit (CPU), a microprocessor, or other data processor chip that performs functions in the system 4.

In one embodiment, the storage device 41 can include various types of non-transitory computer-readable storage mediums. For example, the storage device 41 can be an internal storage system, such as a flash memory, a random access memory (RAM) for the temporary storage of information, and/or a read-only memory (ROM) for permanent storage of information. The storage device 41 can also be an external storage system, such as a hard disk, a storage card, or a data storage medium.

The storage device 41 stores instructions, the processor 42 executes the computer program 43 stored in the storage device 41 for implementing the method for generating an arbitrary waveform of a microwave photon based on optical frequency tuning provided in the embodiments of the present disclosure. The computer program 43 can be an arbitrary waveform generation program and include instructions.

Upon execution of the instructions stores in the storage device 41, the processor 42 is configured to:
generate narrow optical pulse signals with high stability and low phase noise through an optical frequency comb;
divide the narrow optical pulse signals into two channels, a first channel performing a frequency doubling or frequency dividing process on the repetition frequency of the narrow optical pulse signals, and a second channel performing photoelectric conversion on the narrow optical pulse signals to generate an electrical frequency comb, and performing an electrical process on the electrical frequency comb to generate a frequency shift driving electrical waveform required for optical frequency shift;
divide the optical pulse signals after the frequency doubling or dividing into two channels, after one channel of the optical pulse signals is driven by the frequency-shift driving electrical waveform to be frequency shifted, the channel of the optical pulse signals being combined with the other channel of the optical pulse signals that are not frequency-shifted, and outputting the combined optical pulse signals;
perform photoelectric conversion on the combined optical pulse signals, and generate an electrical waveform;
filter out an electrical waveform with a specific frequency spectrum required by a user from the electrical waveform generated after the photoelectric conversion by electrical filtering;
perform power amplification on the filtered electrical waveform, and obtain a required electrical waveform for outputting to the user.

Technical features in the above embodiments can be combined arbitrarily. For concise description, not all possible combinations of the technical features in the above embodiments are described. However, any combination of the technical features described in the above embodiments should fall within the scope of the present disclosure, as long as no conflict occurs between the combined technical features.

The above embodiments, which are described in detail, are merely some implementations of the present disclosure, but they should not be construed to limit the scope of the present disclosure. It should be pointed out that, various modifications and improvements can be made by those skilled in the art without departing from the concept of the present disclosure. These modifications and improvements shall be encompassed by the protection scope of the present disclosure as defined by the appended claims.

What is claimed is:

1. A system for generating an arbitrary waveform of a microwave photon based on optical frequency tuning, comprising:
at least one processor; and
a storage device coupled to the at least one processor and storing instructions for execution by the at least one processor to cause the at least one processor to:
generate narrow optical pulse signals with high stability and low phase noise through an optical frequency comb;
divide the narrow optical pulse signals output by the optical frequency comb into two channels through a first optical distribution unit, wherein one channel of the narrow optical pulse signals is output to a first photoelectric conversion unit, and the other channel of the narrow optical pulse signals is output to an optical frequency doubling/dividing unit;
perform photoelectric conversion on the narrow optical pulse signals transmitted by the first optical distribution unit through the first photoelectric conversion unit, and output an electrical frequency comb;
generate a frequency-shift driving electrical waveform for driving an optical frequency-shift combining optical circuit according to the electrical frequency comb through a frequency-shift drive circuit;
perform frequency doubling or dividing on a repetition frequency of the narrow optical pulse signals output by the optical frequency comb through the optical frequency doubling/dividing unit;
divide optical pulse signals output by the optical frequency doubling/dividing unit into two channels through the optical frequency-shift combining optical circuit, wherein one channel of the optical pulse signals is optically frequency-shifted by driving of the frequency-shift driving electrical waveform, and is combined with the other channel of the optical pulse signals that is not frequency-shifted for output;

perform the photoelectric conversion on the combined optical pulse signals, and output an electrical waveform through a second photoelectric conversion unit; and perform an electrical process on the electrical waveform, and obtain an electrical waveform with a specific frequency spectrum through a second electrical processing circuit.

2. The system according to claim 1, wherein the optical frequency-shift combining optical circuit comprises a second optical distribution unit, an optical combining unit, and an optical frequency-shift unit; wherein the at least one processor is further caused to:

divide the narrow optical pulse signals output by the optical frequency doubling/dividing unit into two channels through the second optical distribution unit, wherein one channel of the narrow optical pulse signals is transmitted to the optical combining unit, and the other channel of the narrow optical pulse signals is transmitted to the optical frequency-shift unit;

perform a spectral shift on the narrow optical pulse signals transmitted by the second optical distribution unit according to the frequency-shift driving electrical waveform transmitted by the frequency-shift drive circuit; and combine the narrow optical pulse signals transmitted by the second optical distribution unit and the optical frequency-shift unit through the optical combining unit for output.

3. The system according to claim 1, wherein the frequency-shift drive circuit comprises a first electrical processing circuit and an electrical waveform generation unit; wherein the at least one processor is further caused to:

perform an electrical process on the electrical frequency comb through the first electrical processing circuit, obtain signals with a specific frequency, and determine the signals with the specific frequency to be frequency reference signals or local oscillator signals of the electrical waveform generation unit; and generate a basic electrical waveform according to the input frequency reference signals or the local oscillator signals through the electrical waveform generation unit, and determine the basic electrical waveform to be the frequency-shift driving electrical waveform for driving the optical frequency-shift unit.

4. The system according to claim 3, wherein the first electrical processing circuit comprises a first electrical filtering unit and a first electrical amplifying unit; the at least one processor is further caused to:

filter the electrical frequency comb through the first electrical filtering unit, and obtain the frequency reference signals or the local oscillator signals with the specific frequency; and amplify signals output by the first electrical filtering unit through the first electrical amplifying unit.

5. The system according to claim 1, wherein the second electrical processing circuit comprises a second electrical filtering unit and a second electrical amplifying unit; the at least one processor is further caused to:

filter the electrical waveform output by the second photoelectric conversion unit through the second electrical filtering unit, and obtain a required electrical waveform; and amplify the required electrical waveform output by the second electrical filtering unit through the second electrical amplifying unit.

6. A method for generating an arbitrary waveform of a microwave photon based on optical frequency tuning, comprising:

generating narrow optical pulse signals with high stability and low phase noise through an optical frequency comb;

dividing the narrow optical pulse signals into two channels, performing a frequency doubling or frequency dividing process on a repetition frequency of the narrow optical pulse signals by a first channel, and performing photoelectric conversion on the narrow optical pulse signals by a second channel to generate an electrical frequency comb, and performing an electrical process on the electrical frequency comb by the second channel to generate a frequency-shift driving electrical waveform required for optical frequency-shift;

dividing optical pulse signals after the frequency doubling or dividing process into two channels, after driving one channel of the optical pulse signals by the frequency-shift driving electrical waveform to be frequency shifted, combing the one channel of the optical pulse signals being with the other channel of the optical pulse signals that is not frequency-shifted for output;

performing the photoelectric conversion on the combined optical pulse signals, and generating an electrical waveform;

filtering out an electrical waveform with a specific frequency spectrum from the electrical waveform generated after the photoelectric conversion by electrical filtering; and performing power amplification on the filtered electrical waveform for output.

7. The method according to claim 6, wherein the performing the electrical process on the electrical frequency comb by the second channel to generate the frequency-shift driving electrical waveform required for the optical frequency-shift comprises:

filtering out signals with a specific frequency from the electrical frequency comb by the electrical filtering, and taking the signals with the specific frequency as frequency reference signals or local oscillator signals;

performing the power amplification on the frequency reference signals or the local oscillator signals; and generating a basic electrical waveform according to the frequency reference signals or the local oscillator signals after the power amplification, and taking the basic electrical waveform as the frequency-shift driving electrical waveform.

\* \* \* \* \*